United States Patent [19]

Gillette

[11] 4,451,918
[45] May 29, 1984

[54] TEST SIGNAL RELOADER

[75] Inventor: Garry C. Gillette, Westlake Village, Calif.

[73] Assignee: Teradyne, Inc., Boston, Mass.

[21] Appl. No.: 309,982

[22] Filed: Oct. 9, 1981

[51] Int. Cl.³ .......................................... G01R 31/28
[52] U.S. Cl. ...................................... 371/27; 364/900
[58] Field of Search .................. 371/27; 364/200, 900

[56] References Cited

U.S. PATENT DOCUMENTS

| 2,905,930 | 9/1959 | Golden | 340/174 |
|---|---|---|---|
| 3,235,849 | 2/1966 | Klein | 340/172.5 |
| 3,311,890 | 3/1967 | Waaben | 340/172.5 |
| 3,474,421 | 10/1969 | Stein | 340/174 |
| 3,631,406 | 12/1971 | Kurner | 364/200 |
| 3,739,349 | 6/1973 | Burdette | 340/172.5 |
| 3,761,894 | 9/1973 | Pile et al. | 364/200 |
| 3,772,657 | 11/1973 | Marsalka et al. | 364/200 |
| 3,781,829 | 12/1973 | Singh | 340/173 |
| 3,805,243 | 4/1974 | Boisvert | 340/172.5 |
| 3,828,319 | 8/1974 | Owen et al. | 364/200 |
| 3,832,535 | 8/1974 | De Vito | 371/25 |
| 3,873,818 | 3/1975 | Barnard | 371/25 |
| 3,949,376 | 4/1976 | Ball et al. | 364/200 |
| 4,099,259 | 7/1978 | Parsons et al. | 364/900 |
| 4,137,562 | 1/1979 | Boeck et al. | 364/200 |
| 4,195,343 | 3/1980 | Joyce | 364/200 |
| 4,195,770 | 4/1980 | Benton et al. | 371/21 |
| 4,216,539 | 8/1980 | Raymond | 371/20 |
| 4,249,173 | 2/1981 | Lockhart | 340/731 |
| 4,287,594 | 9/1981 | Shirasaka | 371/25 |

Primary Examiner—Charles E. Atkinson

[57] ABSTRACT

A continuous sequence of test data for testing LSI devices is provided selectably from one of a number of memory elements, each of which is reloaded, when not busy providing test data, from a higher capacity, lower speed storage element.

8 Claims, 2 Drawing Figures

TEST SIGNAL RELOADER

BACKGROUND OF THE INVENTION

This invention relates to providing sequences of test data for testing large-scale integration devices (LSIs).

Typically, sequences of as many as 100,000 separate test signals are injected into various LSI pins, and signals received from various pins are compared with standards. The test data (including test signals and standards) for each pin are stored in high-speed static random access memory dedicated to that pin. Because of the limited capacity of the static random access memory, the test data are sometimes stored in bulk in a high-capacity, dynamic random access memory and, as needed in groups, transferred to the static random access memory. A pause in testing occurs each time the static random access memory is being loaded with a new group of test data.

SUMMARY OF THE INVENTION

In general, the invention features apparatus for providing a continuous sequence of test data for testing LSI devices, each of the devices having a multiplicity of pins, comprising a plurality of memory elements associated with each of the pins, for storing the test data; a storage element having higher capacity and lower speed than each of the memory elements, for storing the test data; test sequence control circuitry for routing the test data selectably from any one of the memory elements to the pins; and reloading circuitry for causing a portion of the test data stored in the storage element to be loaded selectably into any one of the memory elements which is not providing the test data to the pins.

In preferred embodiments, the memory elements comprise static RAMs and the storage element comprises a dynamic RAM; the storage element comprises a plurality of storage sub-elements, and switching circuitry is included for repeatedly in cycles connecting the storage sub-elements to the memory element being reloaded, and for providing in each of the cycles address information to the storage sub-elements, whereby the test data stored in the storage sub-elements are interleaved and loaded into the memory elements at a rate higher than the effective transfer rate of any individual sub-element; the storage sub-elements comprise dynamic RAMs; the sub-elements are associated in groups, a mass storage memory is included for storing the test data, and mass storage switching circuitry is included for causing the mass storage memory to load a portion of the test data selectably into any one of the groups which is not providing test data to the memory elements; the test data are loaded from the storage sub-elements into the memory element being reloaded at a rate higher than the rate at which the test data is being routed to the pins; there are two of the memory elements; and control apparatus is included for causing the test sequence control circuitry and the reloading circuitry to alternately route the test data from a first one of the memory elements while loading test data into another of the memory elements, and loading test data into the first one while routing the test data from another of the memory elements.

The invention enables continuous, economical delivery at high rates of long sequences of test signals, without requiring pauses to reload the static RAM.

DESCRIPTION OF THE PREFERRED EMBODIMENT

We turn now to the structure and operation of the preferred embodiment, first briefly describing the drawings thereof.

DRAWINGS

STRUCTURE

Figure 1:
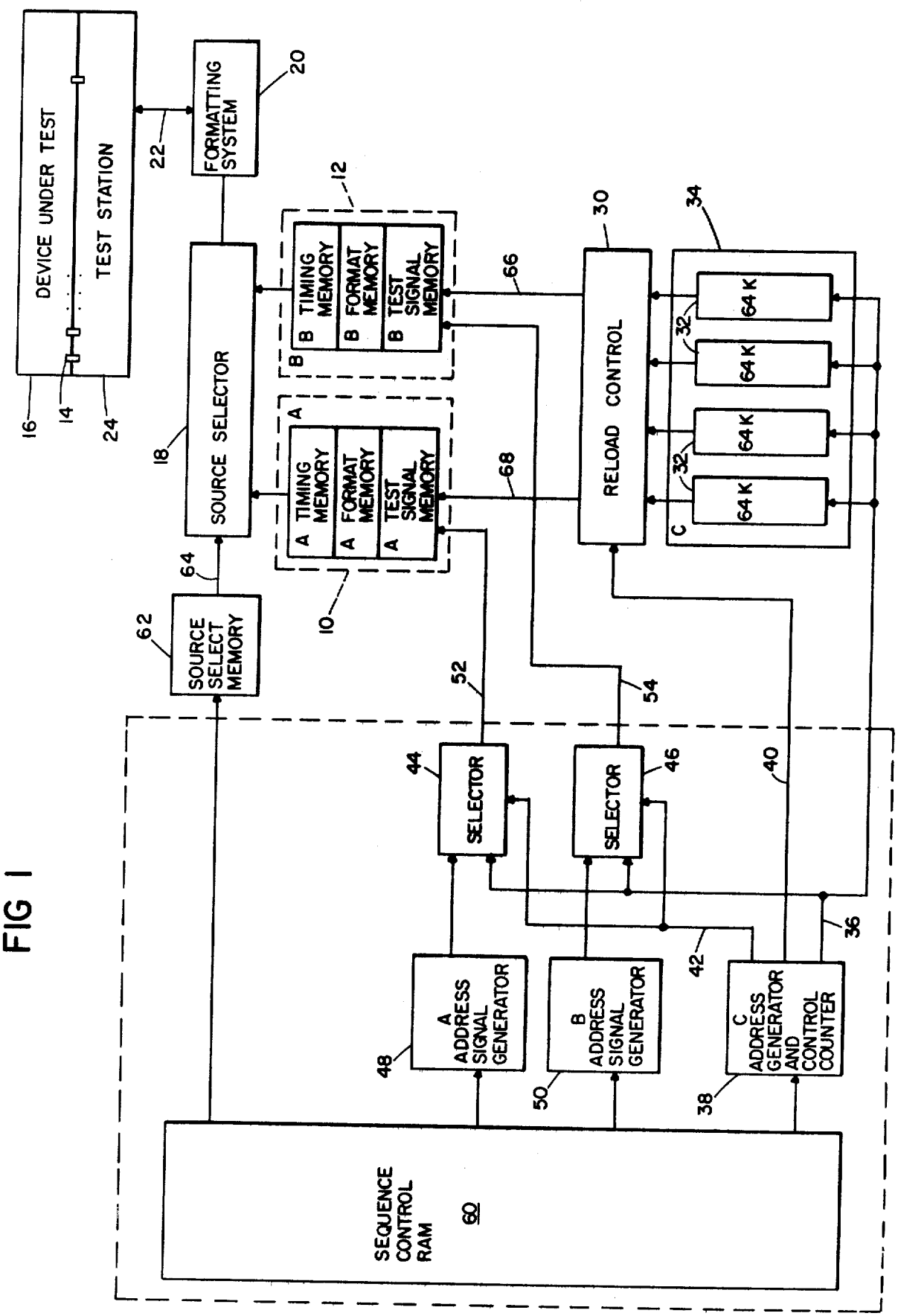
FIG. 1 is a block diagram of an LSI device tester including static memory reloading circuitry according to the invention.

Referring to FIG. 1 in the LSI device tester (the components and operation of which generally correspond to the LSI testing mode of the tester disclosed in U.S. patent application Ser. No. 309,981, titled "Tester for LSI Devices and Memory Devices," George W. Conner, filed concurrently and incorporated herein by reference), identical A and B memories 10, 12 (each a 4K static RAM) contain test data (including test signals, standards, and related timing and format information) for each pin 14 of device under test 16. The outputs of A and B memories 10, 12 are connected through source selector 18 (a conventional multiplexer) to formatting system 20 (containing integrated circuit logic elements including multiplexers for formatting and timing test signal injections and comparisons), which is connected by two-way line 22 to test station 24 (containing pin output follower and conventional pin driver circuitry) holding device under test 16. A and B memories 10, 12 each have an input connected to reload control 30 (a conventional multiplexer), whose four inputs are in turn connected respectively to each of four identical 64K dynamic RAMs 32 (which together comprise C memory 34 and store a pool of test data). The address inputs of all dynamic RAMs 32 are connected by C address line 36 to C address generator and control counter 38 (containing integrated circuit logic and timing circuitry for addressing C memory 34 and controlling the reloading function), which is also connected by control line 40 to reload control 30; by control line 42 to the control inputs of a pair of selectors 44, 46 (conventional multiplexers); and by C address line 36 to data inputs of selectors 44, 46. Selectors 44, 46 have other data inputs connected respectively to A and B address signal generators 48, 50 (containing counters, multiplexers and EXCLUSIVE OR gates), and outputs connected respectively by A and B address lines 52, 54 to address inputs of A and B memories 10, 12. A and B address signal generators 48, 50 and C address generator and control counter 38 are connected to sequence control RAM 60 (a programmable microprocessor having a capacity of 4K instruction words of 112 bits each). RAM 60 is connected to source select memory 62 (a RAM), whose output is connected by source control line 64 to source selector 18, and to circuitry not shown for determining the address of the next control instruction to be executed.

OPERATION

In operation, sequences of test data for all pins are delivered to formatting system 20 alternately from A or B memory 10 or 12, the choice being determined by source selector 18 as dictated by source select memory 62 under the control of sequence control RAM 60. When A memory 10 is selected by source selector 18, it delivers the stored test data from a sequence of its memory locations governed by addresses provided on A address line 52 from A address signal generator 48 through selector 44 (controlled by C address generator and control counter 38). Simultaneously, B memory 12 is being reloaded from C memory 34 over reload line 66. Reload control 30 repeatedly in cycles connects RAMs 32 to A memory 10, while the location in RAM 32 from which data is transferred in each cycle is specified by one of a sequence of addresses carried over line 36. The addresses of the sequence of locations in B memory 12 which receive the transferred data are also carried over C address line 36 through selector 46 (under the control of C address generator and control counter 38) at a rate which is faster than the rate of delivery of the A addresses to A memory 10.

After A memory 10 has exhausted its supply of test data, source selector 18 without delay causes B memory 12 to deliver its newly replenished supply, and A memory 10 is reloaded from C memory 34.

OTHER EMBODIMENTS

Figure 2:
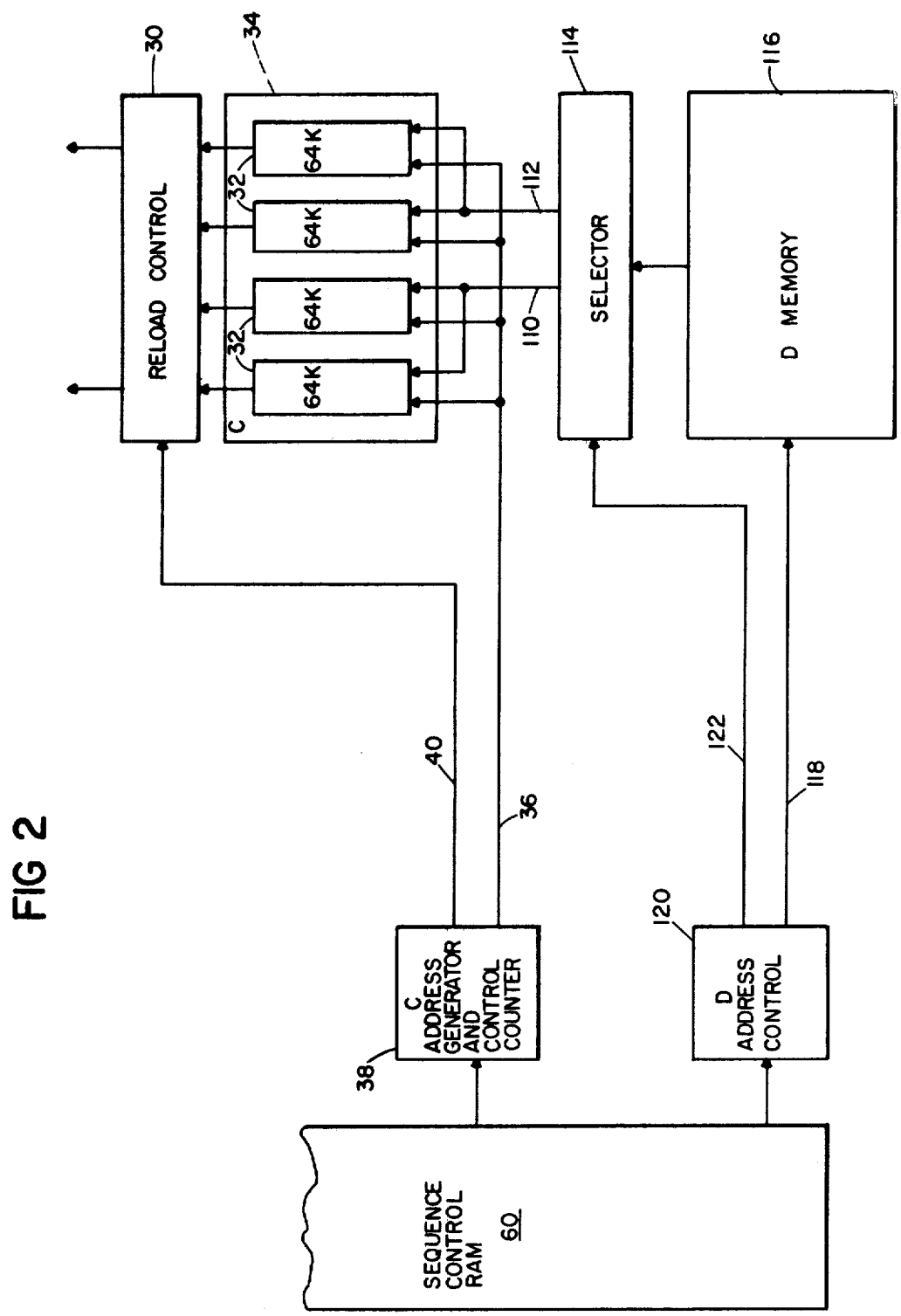
FIG. 2 is a block diagram of a portion of the tester of FIG. 1 including dynamic memory replenishing circuitry.

Other embodiments are within the following claims. For example, referring to FIG. 2, dynamic RAMs 32 can be divided into two groups having their inputs respectively connected by reload lines 110, 112 through selector 114 to mass storage D memory 116. D memory 116 is connected by address line 118 to D address control 120 which is also connected to sequence control RAM 60, and by control line 122 to selector 114. The two groups of RAMs 32 alternately are engaged (through reload control 30) in reloading A and B memories 10 and 12; and while each group is not so engaged, it is being replenished with test data from a pool stored in D memory 116. The switching of the replenishing operation between the two groups is dictated by selector 114 under the control of D address control 120.

What is claimed is:

1. Apparatus for providing a continuous sequence of test data for testing LSI devices, each of said devices having a multiplicity of pins, comprising
    a plurality of memory elements associated with each of said pins, for storing said test data,
    a random access storage element having higher capacity and lower speed than each of said memory elements, for storing said test data,
    test sequence control circuitry for routing said test data selectably from any one of said memory elements to its associated said pin, and
    reloading circuitry for causing a portion of said test data stored in said storage element to be selectably addressed and loaded into any one of said memory elements which is not providing said test data to said pins.

2. The apparatus of claim 1 wherein said memory elements comprise static RAMs and said storage element comprises a dynamic RAM.

3. The apparatus of claim 1 wherein said storage element comprises a plurality of storage sub-elements, and said apparatus further comprises
    switching circuitry for repeatedly in cycles connecting said storage sub-elements to the memory element being reloaded, and for providing in each of said cycles address information to said storage sub-elements, whereby said test data stored in said storage sub-elements are interleaved and loaded into said memory elements at a rate higher than the effective transfer rate of any individual sub-element.

4. The apparatus of claim 3 wherein said memory elements comprise static RAMs and said storage sub-elements comprise dynamic RAMs.

5. The apparatus of claim 3 or 4 wherein said sub-elements are associated in groups and said apparatus further comprises
    a mass storage memory, for storing said test data, and
    mass storage switching circuitry for causing said mass storage memory to load a portion of said test data selectably into any one of said groups which is not providing test data to said memory elements.

6. The apparatus of claim 3 or 4 wherein said test data are loaded from said storage sub-elements into said memory element being reloaded at a rate higher than the rate at which said test data is being routed to said pins.

7. The apparatus of claim 1, 2, 3 or 4 wherein there are two of said memory elements.

8. The apparatus of claim 1, 2, 3 or 4 further comprising
    control apparatus for causing said test sequence control circuitry and said reloading circuitry to alternately route said test data from a first one of said memory elements while loading said test data into another of said memory elements, and loading said test data into said first one while routing said test data from another of said memory elements.

* * * * *